United States Patent
Fukumoto et al.

(10) Patent No.: US 7,221,207 B2
(45) Date of Patent: May 22, 2007

(54) SEMICONDUCTOR SWITCHING CIRCUIT FOR SWITCHING THE PATHS OF A HIGH FREQUENCY SIGNAL IN A MOBILE COMMUNICATIONS UNIT

(75) Inventors: Shinji Fukumoto, Mishima-gun (JP); Katsushi Tara, Kyoto (JP); Tadayoshi Nakatsuka, Osaka (JP); Tomohiko Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 76 days.

(21) Appl. No.: 11/143,632

(22) Filed: Jun. 3, 2005

(65) Prior Publication Data

US 2005/0270119 A1    Dec. 8, 2005

(30) Foreign Application Priority Data

Jun. 4, 2004    (JP)    ............................. 2004-166470

(51) Int. Cl.
*H01P 1/22*    (2006.01)
(52) U.S. Cl. ..................................... 327/365; 333/81 R
(58) Field of Classification Search ................ 327/365, 327/81 R; 333/103, 81 R
See application file for complete search history.

(56) References Cited

U.S. PATENT DOCUMENTS

| | | | | |
|---|---|---|---|---|
| 5,350,957 A | * | 9/1994 | Cooper et al. | 327/427 |
| 5,731,607 A | * | 3/1998 | Kohama | 257/275 |
| 5,774,792 A | * | 6/1998 | Tanaka et al. | 455/78 |
| 5,812,939 A | * | 9/1998 | Kohama | 455/78 |
| 5,883,541 A | * | 3/1999 | Tahara et al. | 327/434 |
| 5,903,178 A | * | 5/1999 | Miyatsuji et al. | 327/308 |
| 5,945,867 A | * | 8/1999 | Uda et al. | 327/431 |
| 5,969,560 A | * | 10/1999 | Kohama et al. | 327/308 |
| 5,990,580 A | * | 11/1999 | Weigand | 307/125 |
| 6,094,088 A | * | 7/2000 | Yano | 327/534 |
| 6,653,697 B2 | * | 11/2003 | Hidaka et al. | 257/393 |
| 6,693,498 B1 | * | 2/2004 | Sasabata et al. | 333/103 |
| 6,867,635 B2 | * | 3/2005 | Westerman | 327/416 |

FOREIGN PATENT DOCUMENTS

| | | |
|---|---|---|
| JP | 53-101260 | 9/1978 |
| JP | 08-223021 | 8/1996 |
| JP | 09-153781 | 6/1997 |
| JP | 2002-176375 | 6/2002 |
| WO | WO 03/107551 A1 | 5/2003 |

* cited by examiner

Primary Examiner—Kenneth B. Wells
(74) Attorney, Agent, or Firm—Steptoe & Johnson LLP

(57) ABSTRACT

A semiconductor apparatus is provided which makes it possible to reduce the number of control terminals required for switching through paths of a high frequency signal, simplify the circuit configuration for controlling the terminals, improve an isolation characteristic between on path and off path of a through FET, and obtain a sufficiently high isolation. In this semiconductor apparatus, one specific through FET and each of shunt FETs connected to each of through FETs other than the one specific through FET are simultaneously turned on in response to the same control signal inputted to the same control terminal. Thus, when a high frequency signal leaks from an output terminal to the signal path of the through FET having been turned on, through the signal paths of the through FETs having been turned off, the high frequency signal can be released to GND through the shunt FET having been turned on.

7 Claims, 8 Drawing Sheets

SEMICONDUCTOR SWITCHING CIRCUIT FOR SWITCHING THE PATHS OF A HIGH FREQUENCY SIGNAL IN A MOBILE COMMUNICATIONS UNIT

FIELD OF THE INVENTION

The present invention relates to a semiconductor apparatus in which a switching circuit for switching the paths of a high frequency signal in a mobile communications unit or the like is integrated by semiconductors.

BACKGROUND OF THE INVENTION

In recent years, as the number of cellular phone users increases, it has become difficult to secure communication lines for cellular phones of a single cellular phone system. Thus, cellular phones each of which responds to more than one cellular phone communication system are demanded on the market. Hence, a switching circuit for switching the frequencies of a number of communication systems without allowing the communication systems to affect other parts is demanded for an antenna.

In order to meet the needs of the market, in a conventional semiconductor apparatus where a switching circuit is integrated by semiconductors (for example, Japanese Patent Laid-Open No. 9-153781), shunt FETs are provided respectively for through FETs (field-effect transistor) allowing the passage of a signal and through FETs for interrupting a signal in signal paths (through). Before a desired inputted high frequency signal leaks to other parts through the interrupting through FET, the high frequency signal is released to a part not affecting the parts of other frequencies or cellular phone systems through the shunt FET allowing the passage of a signal, so that a high isolation is obtained between changeover terminals.

The conventional semiconductor apparatus with an integrated switching circuit will be discussed below in accordance with the accompanying drawings. The drawings only illustrate control signal circuits for switching signal paths by through FETs and capacitor circuits for grounding output terminals to GND in a high frequency manner. DC power supply circuits for supplying power to the FETs are omitted.

First, the following will discuss a "Single Pole Three Throw (hereinafter, referred to as SP3T) switch" having a switching function of switching three output paths for one input path.

FIG. 5 is a circuit diagram showing the configuration of a semiconductor apparatus according to conventional example 1 and is also a circuit diagram showing an SP3T switch. A method of using the SP3T switching circuit will be discussed below. In FIG. 5, reference numeral RF1 denotes an input terminal of a high frequency signal, reference numerals RF2, RF3, and RF4 denote output terminals of a high frequency signal, reference numerals 5, 6, and 7 denote gate bias terminals, reference numerals 5-$a$, 6-$b$, and 7-$c$ denote feedthrough FETs (abbreviated as through FETs), and reference numerals 5-$a$_R, 6-$b$_R, and 7-$c$_R denote gate resistors. In FIG. 5, the through FETs 5-$a$, 6-$b$, and 7-$c$ are N-type channel FETs.

Referring to FIG. 6, an operating principle of transmitting a high frequency signal (RF) from the input terminal RF1 to the output terminal RF4 will be discussed below based on a method of switching through FETs in the semiconductor apparatus of FIG. 5.

In order to turn on the FET, 0 V or a positive voltage not higher than a Schottky barrier voltage (about 0.7 V) is applied as a voltage between the gate and drain terminals and the gate and source terminals of the FET. Thus, the FET is forward biased and the channel of the FET is opened, so that an RF signal is transmitted between the input terminal RF1 and the output terminal RF4. In order to turn off the FET, a voltage between the gate and drain of the FET and a voltage between the gate and source of the FET are set to the equivalent voltage of the threshold of the FET or lower. Hence, the channel of the FET is closed and the FET is turned off.

FIG. 6 is a circuit diagram showing an operation when the semiconductor apparatus of conventional example 1 is turned on between the input terminal RF1 and the output terminal RF4. FIG. 6 shows that the gate bias terminals 5 and 6 are set to L (off) and the gate bias terminal 7 is set to H (on) in response to a control signal fed with voltage from an external power supply. Under this condition, a voltage drops on the resistor 7-$c$_R, so that the through FET 7-$c$ is turned on. Hence, when the through FET 7-$c$ is turned on, passage is enabled through a signal path between the input terminal RF1 and the output terminal RF4. Example applications for the operating principle of the SP3T switch include a Single Pole four Throw (SP4T) switch and a Single Pole five Throw (SP5T) switch.

The items of characteristic evaluation of an antenna switch using FETs include an insertion loss, an isolation, harmonics, a ratio of leakage power between adjacent channels. An insertion loss is a degree of attenuation of an RF signal passing between the source and drain of the through FET 7-$c$ when the RF signal is transmitted from the input terminal RF1 to the output terminal RF4. An isolation is a degree of leakage of an RF signal to the other output terminals RF2 and RF3 when the RF signal is transmitted from the input terminal RF1 to the output terminal RF4. A low insertion loss and a high isolation are demanded as ideal characteristics of a switching circuit used as an antenna switch. An insertion loss and an isolation are also items of characteristic evaluation of a small signal.

On the other hand, in the switching circuit shown in FIGS. 5 and 6, only the through FETs are present on the signal paths. Thus, an insertion loss increases at a specific frequency of a high frequency signal transmitted to each of the signal paths and an isolation deteriorates between the on path and the off path of the through FET.

In order to prevent these problems, the shunt FET is arranged between the output terminal and the through FET on the signal path. A unit for particularly reducing an insertion loss and improving an isolation will be discussed below in accordance with an illustration of SP3T.

FIG. 7 is a circuit diagram showing the configuration of a semiconductor apparatus of conventional example 2 and is also a circuit diagram showing SP3T type switches constituting shunt FETs near output terminals RF2, RF3, and RF4. The shunt FETs are configured near the output terminals, respectively. Referring to FIG. 8, the following will particularly describe a switching principle allowing passage between an input terminal RF1 and the output terminal RF4 when the SP3T type switching circuit of FIG. 7 is operated.

A through FET 7-$c$ on ON path between the input terminal RF1 and the output terminal RF4 is turned on, and a shunt FET 5-$c$ between the output terminal RF4 and a capacitor C10 having one terminal connected to GND 10 is turned off. On OFF path between the input terminal RF1 and the output terminal RF2 and between the input terminal RF1 and the output terminal RF3, a through FET 5-$a$ and a through FET 6-$b$ on OFF path are turned off, and a shunt FET 6-$a$ between the output terminal RF2 and a capacitor C8 having one terminal connected to GND 8 and a shunt FET 7-*b* between the output terminal RF3 and a capacitor C9 having one terminal connected to GND 9 are turned on. Consequently, an RF signal is transmitted from the input terminal RF1 to the output terminal RF4 and an RF signal transmitted to the OFF path is grounded to the GND 8 and GND 9 through the capacitor C8 and the capacitor C9, thereby reducing the leakage of the RF signal to the output terminal of the OFF path.

However, as shown in FIGS. 7 and 8, the semiconductor apparatus where the conventional switching circuit is formed requires six voltage control terminals for controlling on/off of the FETs on the three paths and the shunt FETs connected to the FETs, for example, in the SP3T, resulting in a complicated circuit configuration for controlling the switching operation of the semiconductor apparatus having such a switching function.

In other words, when the switching circuit principle illustrated in FIG. 8 is used based on the configuration of FIG. 7, the terminals for controlling the FETs have to operate separately, and thus control terminals 5', 6' and 7' for the shunt FETs are necessary in addition to the control terminals 5, 6, and 7 for the feedthrough FETs. Thus, six control terminals are necessary in total. Alternatively, Logic for controlling terminals in a complicated configuration has to be used to reduce the number of times of control on the control terminals.

The present invention is devised to solve the problem and provides a semiconductor apparatus which makes it possible to reduce the number of control terminals required for switching the through paths of a high frequency signal, simplify the circuit configuration for controlling the terminals, improve an isolation characteristic between the on path and off path of the through FET, and obtain a sufficiently high isolation.

DISCLOSURE OF THE INVENTION

In order to solve the problem, a semiconductor apparatus according to a first aspect of the present invention, in which a single pole N throw (N is an integer not less than 3) switching circuit is integrated by semiconductors, comprises N signal lines for transmitting high frequencies to N high frequency ports, N through switch elements which are disposed on the N signal lines and switch the transmission of the high frequencies to the high frequency ports, and N−1 shunt switch elements for connecting the high frequency port sides of the through switch elements to ground via capacitors, wherein one of the N though switch elements is controlled to transmit the high frequency, while using a signal for the high frequency transmission control, each of the through switch elements other than the one for transmitting the high frequency is controlled so that one shunt switch element of each N−1 shunt switch element is connected to ground via the capacitor.

Further, the control signal for controlling the transmission of the high frequency by the through switch element and the control signal for controlling the connection to ground made by the shut switch element for each through switch element are simultaneously supplied from a common control terminal.

With this configuration, one specific through switch element and each of the shunt switch elements connected to each of the through switch elements other than the one specific through switch element are simultaneously turned on in response to the same control signal. Thus, when a high frequency signal leaks from the output high frequency port through the signal paths of the through switch elements, which have been turned off, to the signal path of the through switch element having been turned on, the high frequency signal can be released to ground through the shunt switch elements having been turned on and through the capacitors.

A semiconductor apparatus according to a second aspect of the present invention, comprises a circuit integrated by semiconductors, the circuit comprising first to m (m is an integer not less than 3) basic switch sections each being constituted of n (n is an integer) switching elements connected in series, the m basic switch sections being connected to input/output terminals of the circuit, wherein the semiconductor apparatus further comprises k (k is an integer not larger than m−1) shunt circuits connected between ground and all the m input/output terminals, and control signals of the first tom basic switch sections are used as control signals of the k shunt circuits.

A semiconductor apparatus according to a third aspect of the present invention, comprises a circuit integrated by semiconductors, the circuit comprising first to m (m is an integer not less than 3) basic switch sections each being constituted of n (n is an integer) switching elements connected in series, the m basic switch sections having one end terminals connected in common to be a common terminal and the other terminals connected respectively to input/output terminals, wherein the semiconductor apparatus further comprises k (k is an integer not larger than m−1) shunt circuits connected between ground and any one or all of them input/output terminals, and control signals of the first to m basic switch sections are used as control signals of the k shunt circuits.

A semiconductor apparatus according to a fourth aspect of the present invention, comprises a circuit integrated by semiconductors, the circuit comprising first to m (m is an integer not less than 3) basic switch sections each being constituted of n (n is an integer) switching elements connected in series, the m basic switch sections having one end terminals connected in common to be a common terminal and the other end terminals connected respectively to input/output terminals, wherein the semiconductor apparatus further comprises a shunt circuit connected between ground and any one of the input/output terminals, and used as a control signal of the shunt circuit is a logical addition of a plurality of control signals other than the control signal of the basic switch section corresponding to the any one of the input/output terminals.

A semiconductor apparatus according to a fifth aspect of the present invention, comprises a circuit integrated by semiconductors, the circuit comprising first to m (m is an integer not less than 3) basic switch sections each being constituted of n (n is an integer) switching elements connected in series, the m basic switch sections having one end terminals connected in common to be a common terminal and the other end terminals connected respectively to input/output terminals, wherein the semiconductor apparatus further comprises k (k is an integer not larger than m−1) shunt circuits connected between ground and any one of the input/output terminals, and used as control signals of the k shunt circuits are some or all of a plurality of control signals other than a control signal of the basic switch section corresponding to the any one of the input/output terminals.

The switching element comprises a field-effect transistor as the switching element and the control signal is applied to the gate electrode of the field-effect transistor.

The n switching elements each comprising the field-effect transistor constitute a multigate field-effect transistor and the control signal is applied to the gate electrodes of the multigate field-effect transistor.

With this configuration, one specific basic switch section and each of the shunt circuits connected to all the basic switch sections other than the one specific basic switch section are simultaneously turned on in response to the same control signal. Thus, when a high frequency signal leaks from the high frequency port serving as an input/output terminal through the signal paths of the basic switch sections, which have been turned off, to the signal path of the basic switch section having been turned on, the high frequency signal can be released to ground through the shunt circuits having been turned on and through the capacitors.

As described above, according to the present invention, one specific through switch element and each of the shunt switch elements connected to each of the through switch elements other than the one specific through switch element are simultaneously turned on in response to the same control signal. Thus, when a high frequency signal leaks from the output high frequency port through the signal paths of the through switch elements, which have been turned off, to the signal path of the through switch element having been turned on, the high frequency signal can be released to ground through the shunt switch elements having been turned on and through the capacitors.

Further, one specific basic switch section and each of the shunt circuits connected to each of the basic switch sections other than the one specific basic switch section are simultaneously turned on in response to the same control signal. Thus, when a high frequency signal leaks from the high frequency port serving as an input/output terminal through the signal paths of the basic switch sections, which have been turned off, to the signal path of the basic switch section having been turned on, the high frequency signal can be released to ground through the shunt circuits having been turned on and through the capacitors.

With these configurations, it is possible to reduce the number of control terminals required for switching the signal paths of a high frequency signal, simplify the circuit configuration for controlling the terminals, improve an isolation characteristic between the on path and off path of a through switch element, and obtain a sufficiently high isolation.

The semiconductor apparatus of the present invention makes it possible to reduce the number of control terminals required for switching the through paths of a high frequency signal, simplify the circuit configuration for controlling the terminals, improve an isolation characteristic between the on path and off path of a through FET, and obtain a sufficiently high isolation. The semiconductor apparatus can be applied to a switching circuit for switching the paths of a high frequency signal in a mobile communications unit or the like.

DESCRIPTION OF THE EMBODIMENTS

Referring to the accompanying drawings, the following will specifically describe a semiconductor apparatus according to embodiments of the present invention. A switch MMIC for a cellular phone will be discussed below.

In these embodiments, the number (N) of high frequency ports is three. No matter how many high frequency ports, the present invention can be implemented as long as N is a given integer. Further, in these embodiments, field-effect transistors (FETs), which are active elements, are used as a through switch element and a shunt switch element. No matter what device (including a passive element such as an analog switch) other than an FET is used, the present invention can be similarly implemented as long as the device (element) has a switching function by means of a control signal. The drawings only illustrate control signal circuits for switching signal paths by through FETs and capacitor circuits for grounding output terminals to GND in a high frequency manner. DC power supply circuits for supplying power to the FETs are omitted.

(Embodiment 1)

A semiconductor apparatus will be discussed below according to Embodiment 1 of the present invention.

Figure 1:
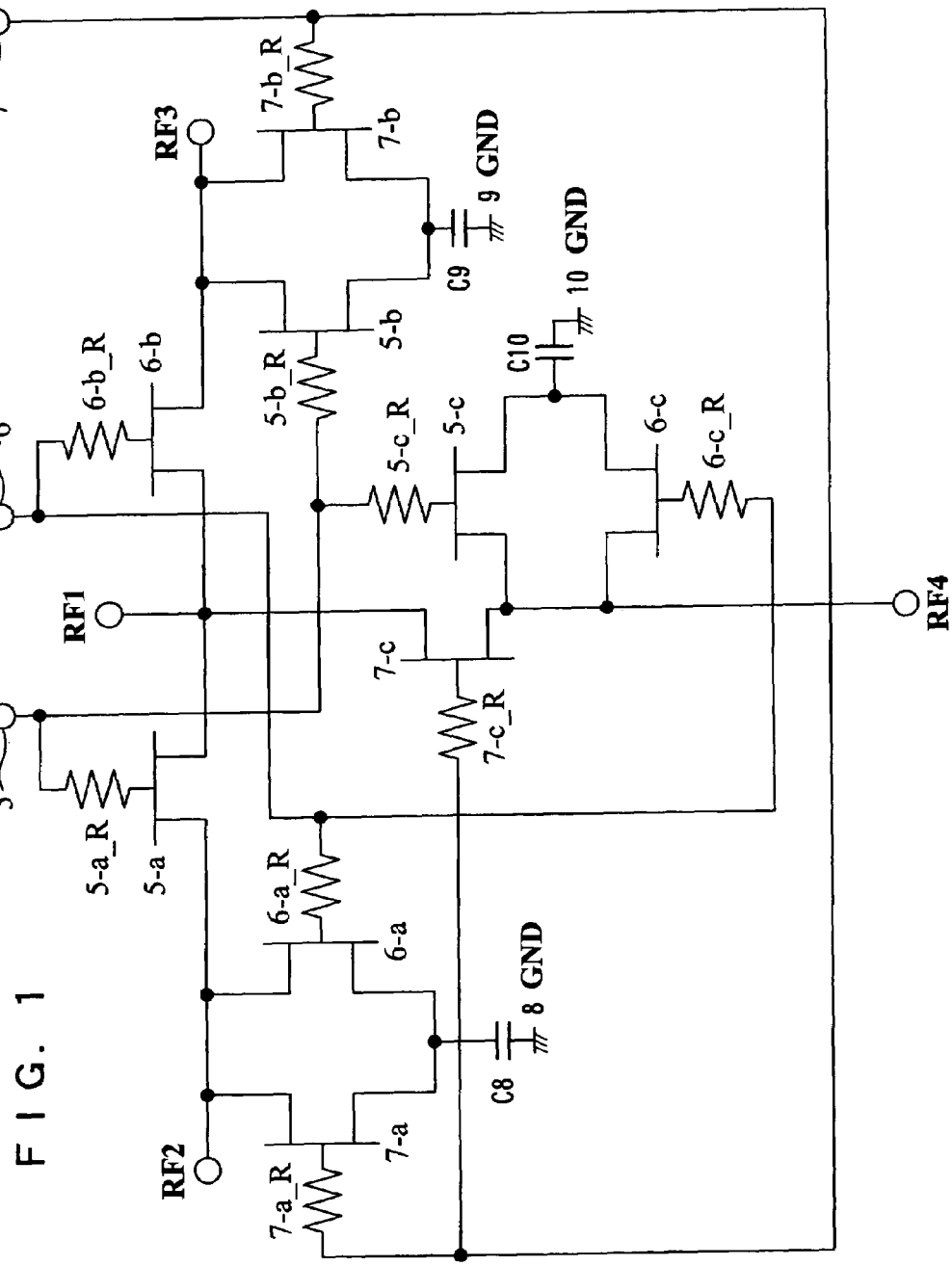
FIG. 1 is a circuit diagram showing the configuration of a semiconductor apparatus according to Embodiment 1 of the present invention.

FIG. 1 is a circuit diagram showing the configuration of the semiconductor apparatus according to Embodiment 1. In this semiconductor apparatus, shunt FETs are basically configured so as to solve the foregoing problems. Control Logic serving as a control circuit for controlling on/off of through FETs and shunt FETs is not used.

In FIG. 1, reference numeral RF1 denotes an input terminal for inputting a high frequency signal, reference numerals RF2, RF3, and RF4 denote output terminals serving as high frequency ports for outputting high frequency signals, reference numerals 5, 6, and 7 denote gate bias terminals serving as control terminals, reference numerals 5-$a$, 6-$b$, and 7-$c$ denote through FETs serving as through switch elements, reference numerals 5-$a$_R, 6-$b$_R, and 7-$c$_R denote gate resistors for controlling the through FETs, reference numerals 6-$a$, 7-$a$, 5-$b$, 7-$b$, 5-$c$, and 6-$c$ denote shunt FETs serving as shunt switch elements, reference numerals 6-$a$_R, 7-$a$_R, 5-$b$_R, 7-$b$_R, 5-$c$_R, and 6-$c$_R denote gate resistors for controlling the shunt FETs, reference numerals 8, 9, and 10 denote grounds (GNDs) which are connected in common and have a ground level voltage, and reference numerals C8, C9, and C10 denote capacitors allowing only the passage of high frequency signals.

The gate bias terminal 5 controls the FETs 5-$a$, 5-$b$, and 5-$c$, the gate bias terminal 6 controls the FETs 6-$a$, 6-$b$, and 6-$c$, and the gate bias terminal 7 controls the FETs 7-$a$, 7-$b$, and 7-c. Further, this switching circuit is applicable to a circuit other than an SP3T switching circuit and also applicable to an SPNT (N is 3 or larger) switch.

In Embodiment 1, bypass capacitors are used. The same effect can be obtained even when the bypass capacitors are not used. In this case, a negative voltage has to be applied as a control voltage to the FET to be turned off. Moreover, the FET used for the switching circuit has symmetrical structures between the drain and gate and between the source and gate. Any one of the terminals may be connected to the bypass capacitor.

Figure 2:
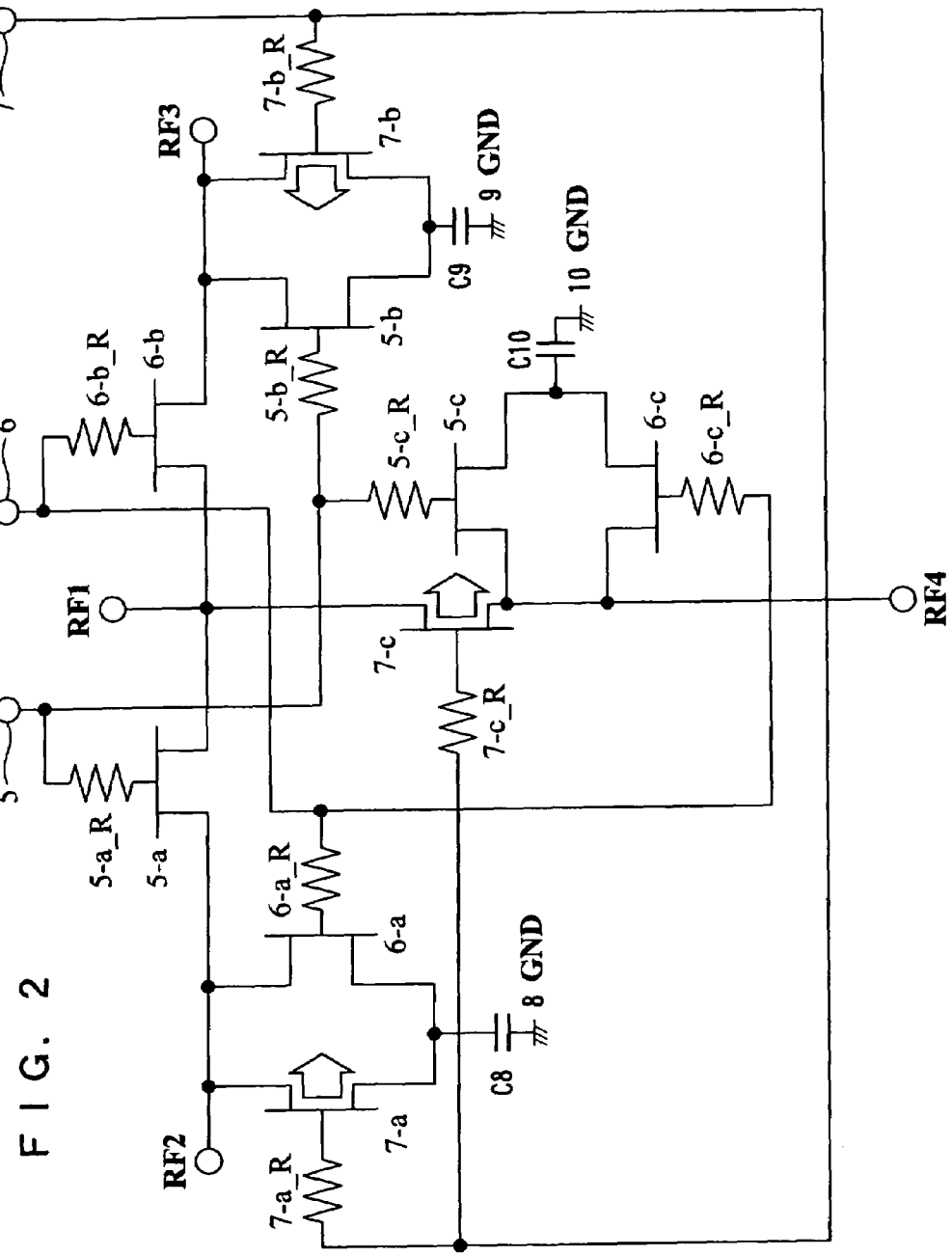
FIG. 2 is a circuit diagram showing an operation of turning on an electric pathway between RF1 and RF4 in the semiconductor apparatus of Embodiment 1.

Based on the configuration of FIG. 1, as shown in FIG. 2, control is exercised in such a way that a control signal is applied to the gate bias terminal 7, the shunt FETs 7-a and 7-b are turned on while only the through FET 7-c of the three through FETs is turned on, and a high frequency signal inputted from the input terminal RF1 is transmitted to the output terminal RF4. In this case, regarding the input signal to the input terminal RF1 of the switching circuit in the semiconductor apparatus, an insertion loss is 0.5 dB and an isolation between the on path and off path of the through FET is 25 dB under GPS conditions of frequency f=1575.42 MHz, input signal power Pin=10 dBm, and a logic of Vlogic (H/L)=2.75/0 V. Further, under USCDMA conditions of frequency f=893.42 MHz, input signal power Pin=26 dBm, and a logic of Vlogic (H/L)=2.75/0 V, an insertion loss is 0.3 dB and an isolation between the on path and the off path of the through FET is 33 dB. Moreover, under PCS conditions of frequency f=1910 MHz, input signal power Pin=26 dBm, and a logic of Vlogic (H/L)=2.75/0 V, an insertion loss is 0.3 dB and an isolation between the on path and off path of the through FET is 24 dB.

Figure 5:
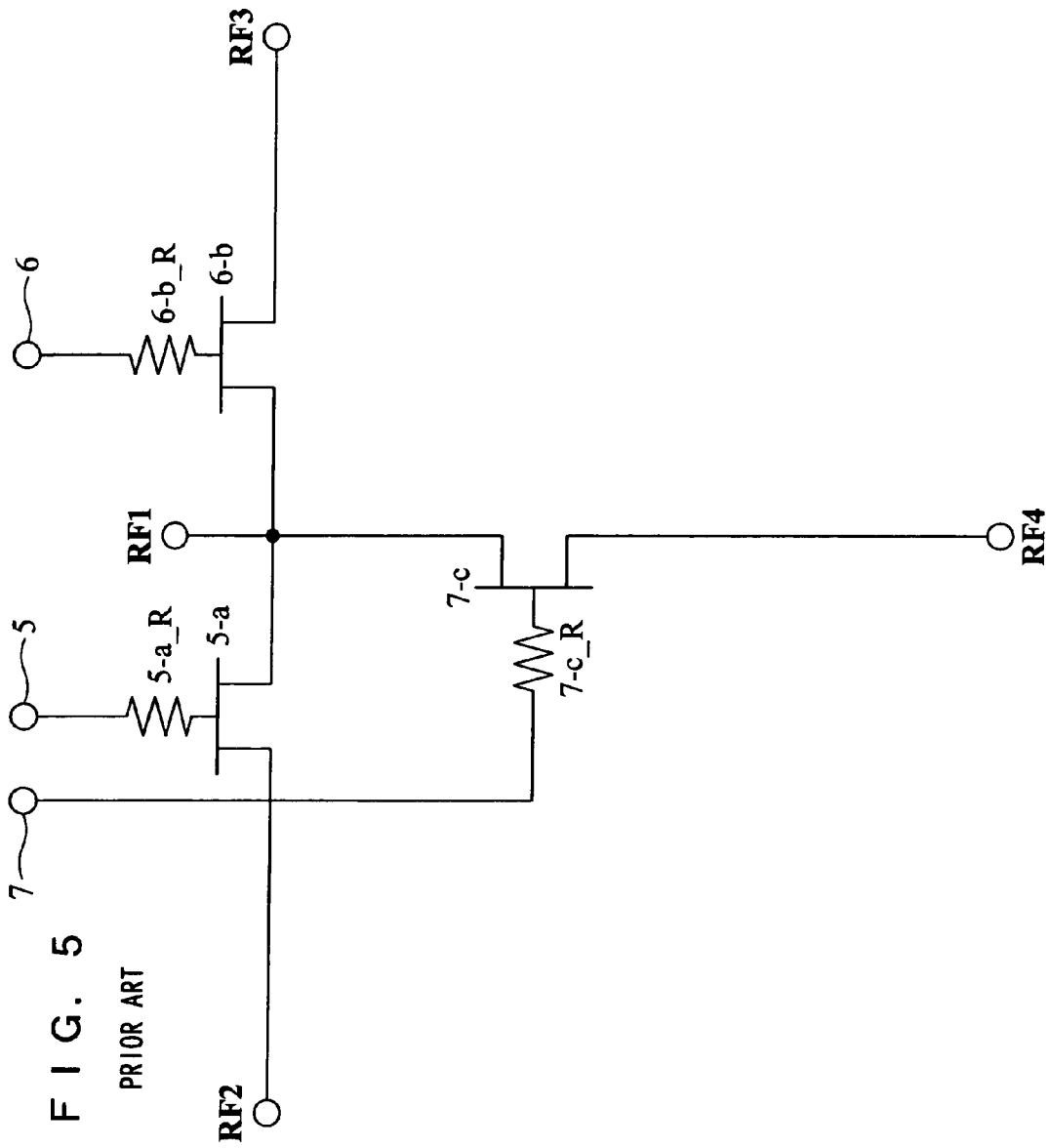
FIG. 5 is a circuit diagram showing the configuration of a semiconductor apparatus according to a conventional example 1.
Figure 6:
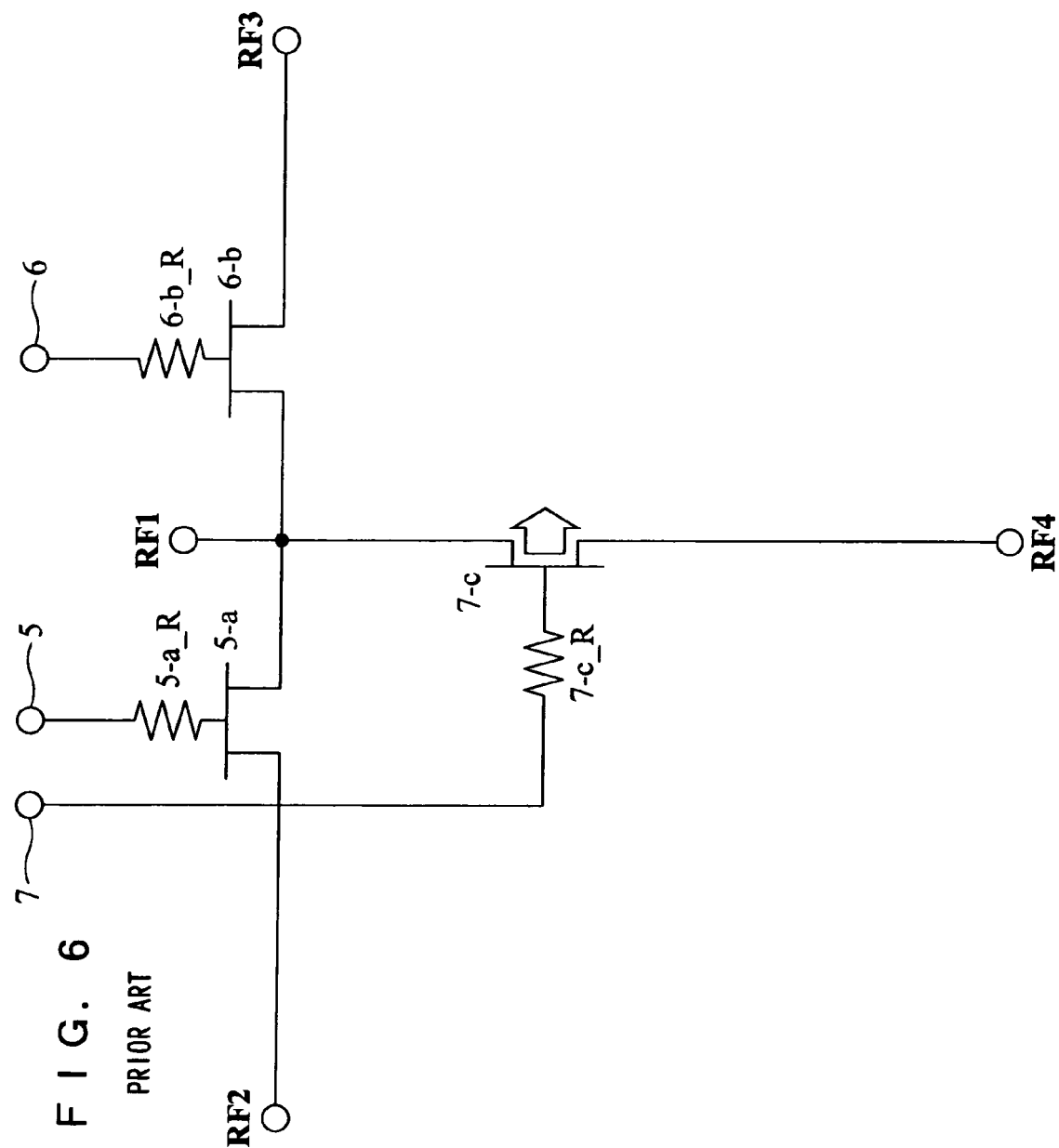
FIG. 6 is a circuit diagram showing an operation of turning on an electric pathway between RF1 and RF4 in the semiconductor apparatus of the conventional example 1.
Figure 7:
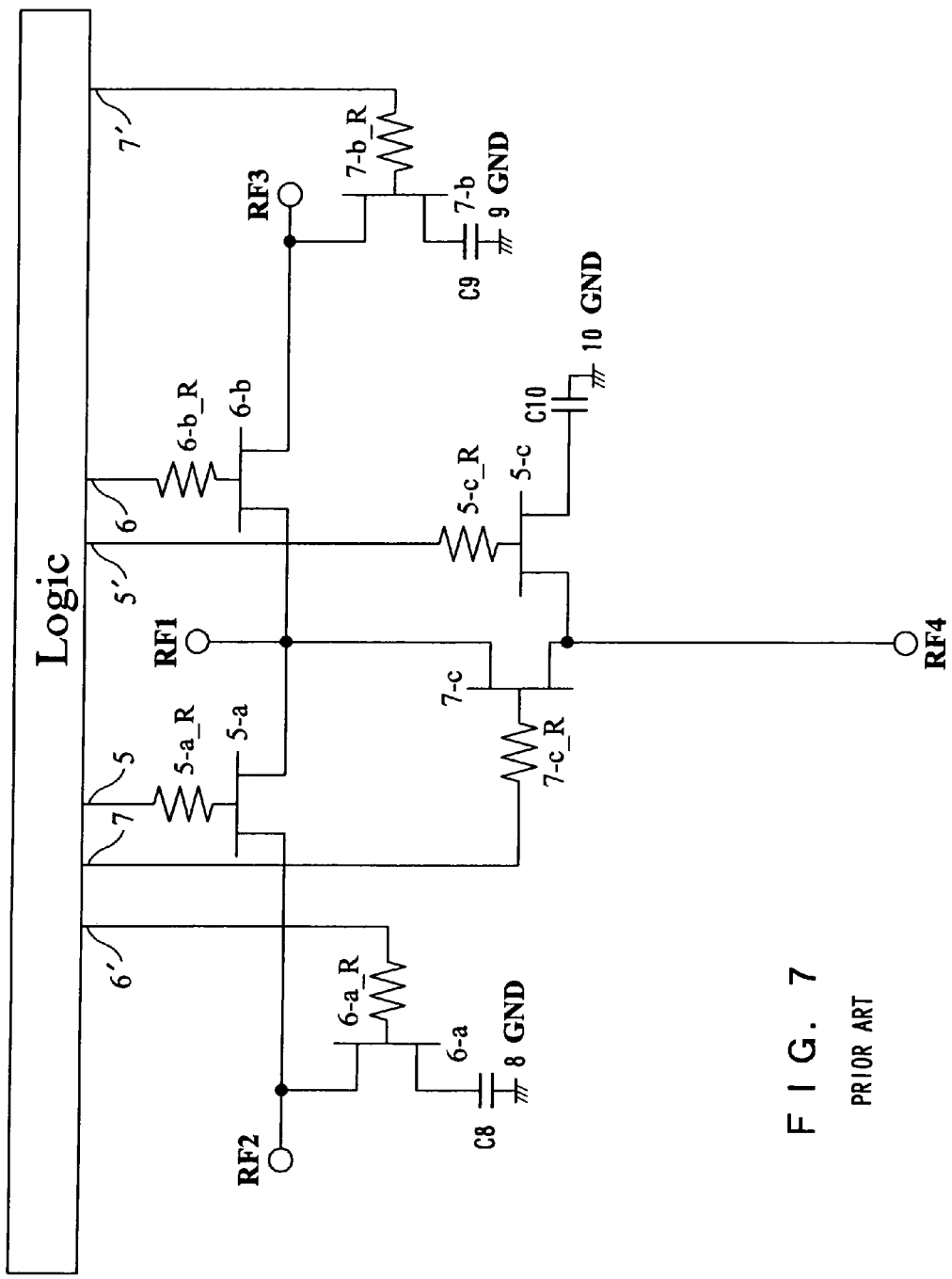
FIG. 7 is a circuit diagram showing the configuration of a semiconductor apparatus according to a conventional example 2.
Figure 8:
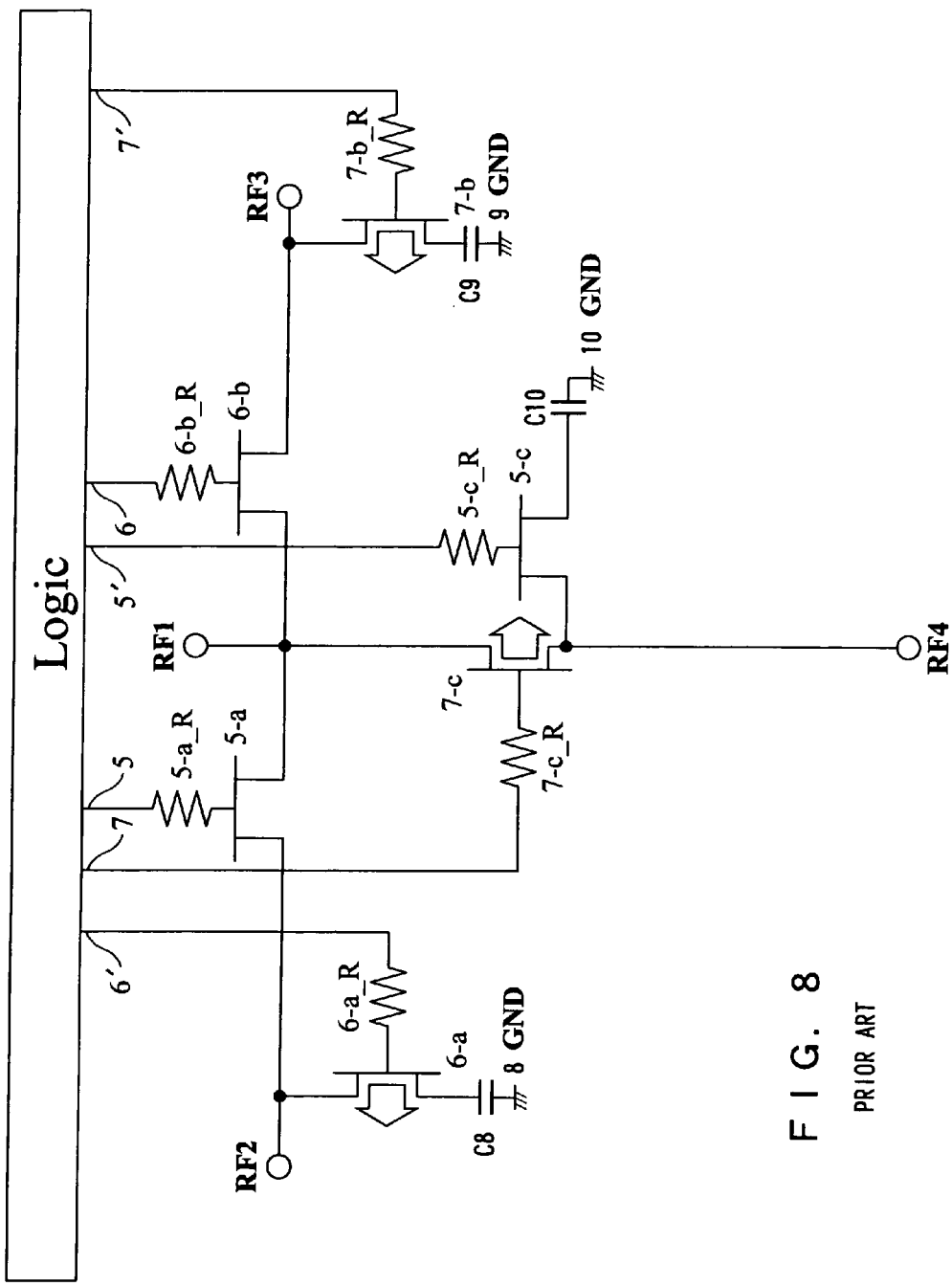
FIG. 8 is a circuit diagram showing an operation of turning on an electric pathway between RF1 and RF4 in the semiconductor apparatus of the conventional example 2.

On the other hand, in the switching circuit of the semiconductor apparatus shown in FIGS. 5 and 6 of the conventional example, under the GPS condition, an insertion loss is 0.4 dB and an isolation is 14 dB. Under the USCDMA conditions, an insertion loss is 0.3 dB and an isolation is 22 dB. Under the PCS conditions, an insertion loss is 0.3 dB and an isolation is 12 dB. With the configuration of the shunt FETs shown in FIG. 1, an isolation between the on path and off path of the through FET is improved.

As described above, in an SP3T type switch, it is possible to configure a circuit in which the shunt FETs can be controlled by the three control terminals while being configured so as to keep a small insertion loss and a high isolation.

For example, as shown in FIG. 2, the one specific through FET 7-c and the shunt FETs 7-a and 7-b out of all the shunt FETs 7-a, 6-a, 5-b, and 7-b connected to the through FETs 5-a and 6-b other than the through FET 7-c are simultaneously turned on in response to a control signal inputted to the same control terminal 7. Thus, in the case of a high frequency signal leaking from the output terminals RF2 and RF3 through the signal paths of the through FETs 5-a and 6-b, which have been turned off, to the signal path of the through FET 7-c having been turned on, the high frequency signal can be released to the GNDs 8 and 9 through the shunt FETs 7-a and 7-b having been turned on and through the capacitors C8 and C9.

(Embodiment 2)

A semiconductor apparatus will be discussed below according to Embodiment 2 of the present invention.

Figure 3:
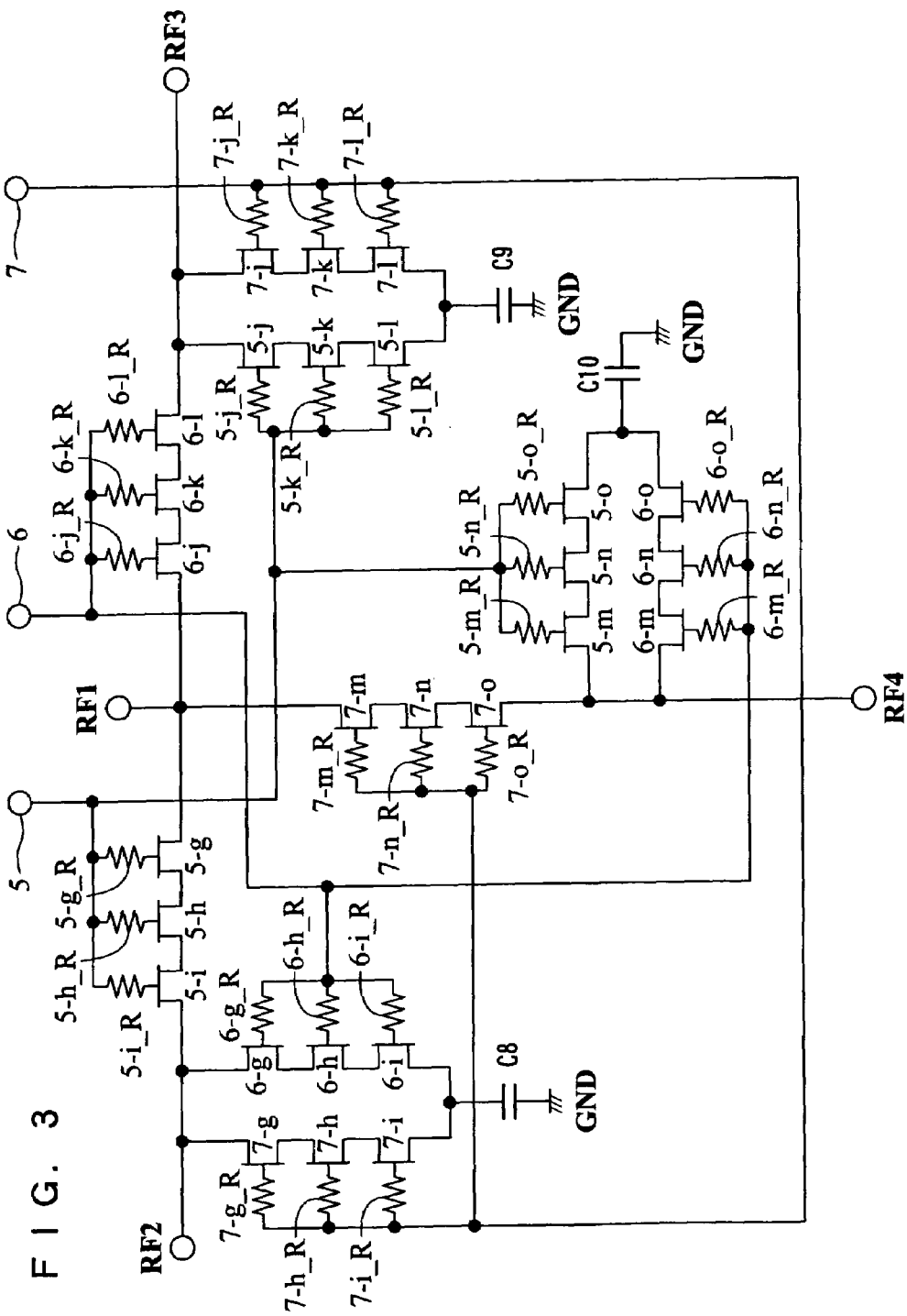
FIG. 3 is a circuit diagram showing the configuration of a semiconductor apparatus according to Embodiment 2 of the present invention.

FIG. 3 is a circuit diagram showing the configuration of the semiconductor apparatus according to Embodiment 2. In FIG. 3, reference numerals RF1 to RF4 denote first to fourth input/output terminals for inputting/outputting high frequency signals and reference numerals 5, 6, and 7 denote control terminals for inputting control signals. Reference numerals 5-g, 5-h, 5-i, 6-j, 6-k, 6-l, 7-m, 7-n, and 7-o denote switching elements which are FETs constituting a transfer circuit (hereinafter, referred to as "transfer FETs") serving as a basic switch section. The n (n is an integer) FETs are connected in series in the transfer circuit. Reference numerals 5-j, 5-k, 5-l, 5-m, 5-n, 5-o, 6-g, 6-h, 6-i, 6-m, 6-n, 6-o, 7-g, 7-h, 7-i, 7-j, 7-k, and 7-l denote FETs for shunt circuits (hereinafter, referred to as "shunt FETs"). Reference numerals 5-i_R, 5-h_R, 5-g_R, 5-j_R, 5-k_R, 5-l_R, 5-m_R, 5-n_R, 5-o_R, 6-g_R, 6-h_R, 6-i_R, 6-j_R, 6-k_R, 6-l_R, 6-m_R, 6-n_R, 6-o_R, 7-g_R, 7-h_R, 7-i_R, 7-j_R, 7-k_R, 7-l_R, 7-m_R, 7-n_R, and 7-o_R denote gate resistors.

The following will discuss the operations of the semiconductor apparatus thus configured.

The basic operation is similar to that of the semiconductor apparatus of Embodiment 1. Embodiment 2 is different from Embodiment 1 in that the transfer circuit corresponding to the through switch element of FIG. 1 has two or more transfer FETs in multiple stages and the shunt circuit corresponding to the shunt switch element of FIG. 1 has two or more shunt FETs in multiple stages.

To be specific, the transfer circuit has the transfer FETs 5-i, 5-h, and 5-g in three stages between RF1 and RF2, the transfer FETs 6-j, 6-k, and 6-l in three stages between RF1 and RF3, and the transfer FETs 7-m, 7-n, and 7-o in three stages between RF1 and RF4.

The shunt circuit has the shunt FETs 7-g, 7-h, and 7-i connected in three stages and the shunt FETs 6-g, 6-h, and 6-i connected in three stages for RF2. The shunt circuit has the shunt FETs 5-j, 5-k, and 5-l connected in three stages and the shunt FETs 7-j, 7-k, and 7-l connected in three stages for RF3. The shunt circuit has the shunt FETs 5-m, 5-n, and 5-o connected in three stages and the shunt FETs 6-m, 6-n, and 6-o connected in three stages for RF4.

In the above manner, as in the semiconductor apparatus of Embodiment 1, the one specific transfer circuit and each of the shunt circuits connected to each of the transfer circuits other than the one specific transfer circuit are simultaneously turned on in response to the same control signal. Thus, in the case of a high frequency signal leaking from the high frequency port serving as an input/output terminal through the signal paths of the transfer circuits, which have been turned off, to the signal path of the transfer circuit having been turned on, the high frequency signal can be released to ground through the shunt circuits having been turned on and through the capacitors.

The semiconductor apparatus of Embodiment 2 may be configured as follows: first to m (m is an integer not less than 3) basic switch sections are provided, each of which is constituted of n (n is an integer) switching elements connected in series, the one terminals of the m basic switch sections are connected in common as a common terminal, the other ends of the m basic switch sections are connected respectively to the input/output terminals, k (k is an integer not larger than m−1) shunt circuits are connected between ground and any one or all of the m input/output terminals, and the control signals of the k shunt circuits are the control signals of the first to m basic switch sections.

The following configuration is also applicable: shunt circuits are connected between ground and any one of the input/output terminals, and the control signals of the shunt circuits are the logical additions (e.g., OR circuits) of a plurality of control signals other than the control signal of the basic switch section corresponding to the any one of the input/output terminals.

Moreover, the following configuration is also applicable: k (k is an integer not larger than m−1) shunt circuits are connected between ground and any one of the input/output terminals, and the control signals of the k shunt circuits are some or all of a plurality of control signals other than the control signal of the basic switch section corresponding to the any one of the input/output terminals.

As described above, according to the configuration of Embodiment 2, the voltage amplitude of a high frequency signal to be inputted/outputted is equally divided into three by the FETs. Thus, it is possible to withstand such a voltage amplitude that is three times as high as that of a single FET. Consequently, upon input of a large signal, it is possible to obtain a more excellent distortion characteristic than by the conventional art.

(Embodiment 3)

A semiconductor apparatus will be discussed below according to Embodiment 3 of the present invention.

Figure 4:
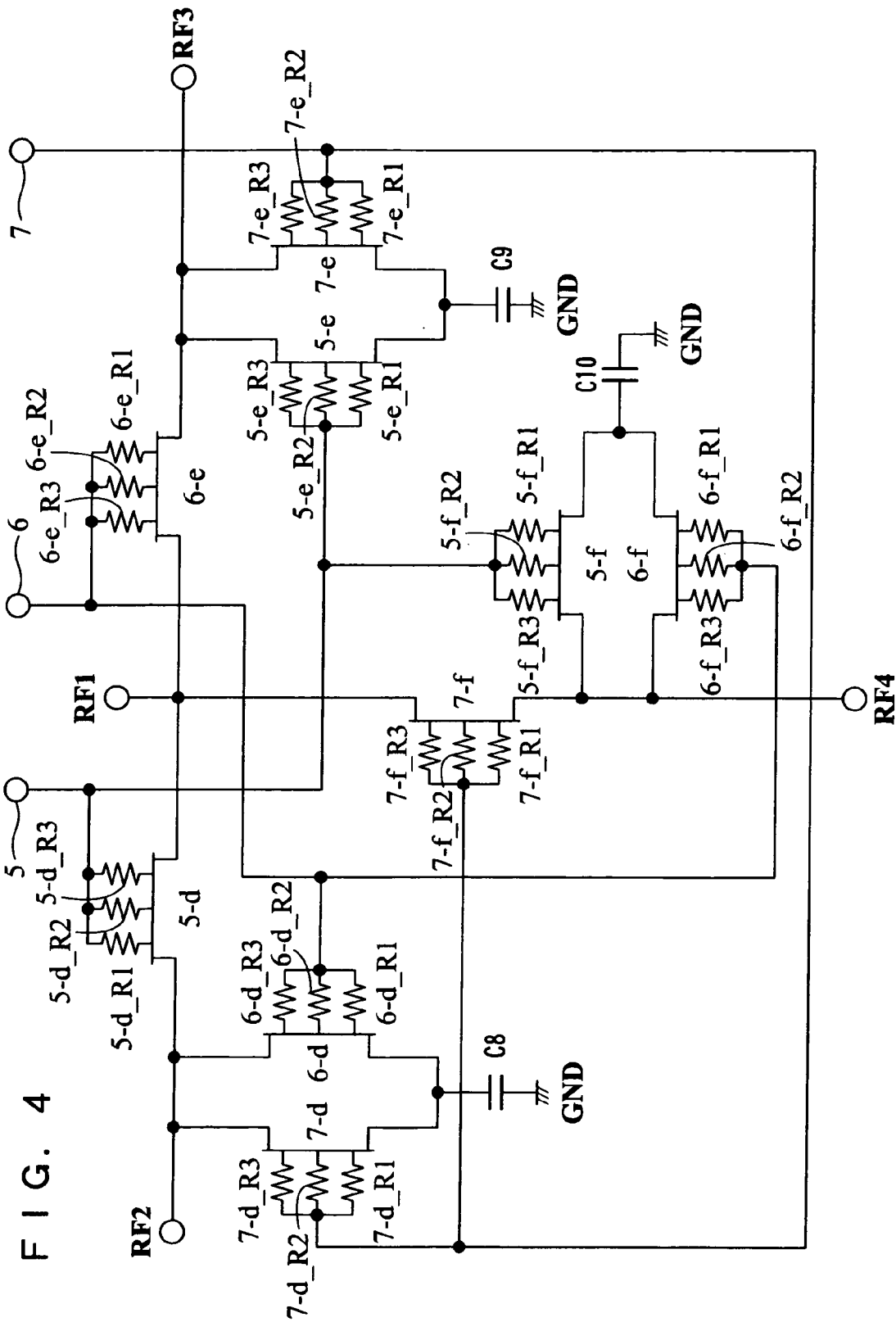
FIG. 4 is a circuit diagram showing the configuration of a semiconductor apparatus according to Embodiment 3 of the present invention.

FIG. 4 is a circuit diagram showing the configuration of the semiconductor apparatus according to Embodiment 3. In FIG. 4, reference numerals RF1 to RF4 denote first to fourth input/output terminals for inputting/outputting high frequency signals and reference numerals 5, 6, and 7 denote control terminals for inputting control signals. Reference numerals 5-d, 6-e, and 7-f denote switching elements which are multigate transfer FETs for a transfer circuit serving as a basic switch section. Reference numerals 5-e, 5-f, 6-d, 6-f, 7-d, and 7-e denote shunt FETs for shunt circuits. Reference numerals 5-d_R1, 5-d_R2, 5-d_R3, 5-e_R1, 5-e_R2, 5-e_R3, 5-f_R1, 5-f_R2, 5-f_R3, 6-d_R1, 6-d_R2, 6-d_R3, 6-e_R1, 6-e_R2, 6-e_R3, 6-f_R1, 6-f_R2, 6-f_R3, 7-d_R1, 7-d_R2, 7-d_R3, 7-e_R1, 7-e_R2, 7-e_R3, 7-f_R1, 7-f_R2, and 7-f_R3 denote gate resistors.

The following will discuss the operations of the semiconductor apparatus thus configured.

The basic operation is similar to those of the semiconductor apparatuses of Embodiments 1 and 2. Embodiment 3 is different from Embodiments 1 and 2 in that transfer FETs acting as transfer circuits and shunt FETs acting as shunt circuits are configured as multigate FETs by using multigate field-effect transistors, and control signals are applied to the gate electrodes of the multigate field-effect transistors from control terminals corresponding the respective gate electrodes.

With this configuration, as in the semiconductor apparatus of Embodiment 2, one specific transfer circuit and each of the shunt circuits connected to each of the transfer circuits other than the one specific transfer circuit are simultaneously turned on by the same control signal. Thus, in the case of a high frequency signal leaking from the high frequency port serving as an input/output terminal through the signal paths of the transfer circuits, which have been turned off, to the signal path of the transfer circuit having been turned on, the high frequency signal can be released to ground through the shunt circuits having been turned on and through the capacitors.

As in Embodiment 2, the semiconductor apparatus of Embodiment 3 may be configured as follows: first to m (m is an integer not less than 3) basic switch sections are provided, each of which is constituted of n (n is an integer) switching elements connected in series, the one end terminals of the m basic switch sections are connected in common to be a common terminal, the other end terminals of the m basic switch sections are connected respectively to the input/output terminals, k (k is an integer not less than m−1) shunt circuits are connected between ground and any one or all of them input/output terminals, and the control signals of the k shunt circuits are the control signals of the first to m basic switch sections.

The following configuration is also applicable: shunt circuits are connected between ground and any one of the input/output terminals, and the control signals of the shunt circuits are logical additions (e.g., OR circuits) of a plurality of control signals other than the control signal of the basic switch section corresponding to the any one of the input/output terminals.

Moreover, the following configuration is also applicable: k (k is an integer not larger than m−1) shunt circuits are connected between ground and any one of the input/output terminals, and the control signals of the k shunt circuits are some or all of a plurality of control signals other than the control signal of the basic switch section corresponding to the any one of the input/output terminals.

As described above, according to the configuration of Embodiment 3, the voltage amplitude of a high frequency signal to be inputted/outputted is equally divided into three by the gate electrodes. Thus, it is possible to withstand a voltage amplitude that is three times as high as that of a single FET, and upon input of a large signal, obtain a more excellent distortion characteristic than by the conventional art. Further, it is possible to reduce an on resistance as compared with FETs in the three-stage configuration, thereby further reducing an insertion loss.

The foregoing embodiments make it possible to reduce the number of control terminals required for switching the through paths of high frequency signals, simplify the circuit configuration for controlling the terminals, improve an isolation characteristic between the on path and off path of a through FET, and obtain a sufficiently high isolation.

What is claimed is:

1. A semiconductor apparatus, comprising:
first, second, and third switch transistor circuits;
first second and third gate bias terminals, a gate of the first switch transistor circuit connected by a resistor to the first gate bias terminal, a gate of the second switch transistor circuit connected by a resistor to the second gate bias terminal, a gate of the third switch transistor circuit connected by a resistor to the third gate bias terminal;
an input terminal connected in parallel to a source of each of the first, second and third switch transistor circuits;
first, second, third, fourth, fifth, and sixth shunt transistor circuits;
a first output terminal connected to a drain of the first switch transistor circuit, the first output terminal connected to a drain of the first and second shunt transistor circuits, a source of each of the first and second shunt transistor circuits connected in parallel by a capacitor to ground, a gate of the first shunt transistor circuit connected by a resistor to the third gate bias terminal, a gate of the second shunt transistor circuit connected by a resistor to the second gate bias terminal;
a second output terminal connected to a drain of the second switch transistor circuit, the second output terminal connected to a drain of the third and fourth shunt transistor circuits, a source of each of the third and fourth shunt transistor circuits connected by a capacitor to ground, a gate of the third shunt transistor circuit connected by a resistor to the first gate bias terminal, a gate of the fourth shunt transistor circuit connected by a resistor to the third gate bias terminal; and
a third output terminal connected to a drain of the third switch transistor circuit, the third output terminal connected to a drain of the fifth and sixth shunt transistor circuits, a source of each of the fifth and sixth shunt transistor circuits connected by a capacitor to ground, a gate of the fifth shunt transistor circuit connected by a resistor to the first gate bias terminal, a gate of the sixth shunt transistor circuit connected by a resistor to the second gate bias terminal.

2. The semiconductor apparatus of claim 1, wherein each switch transistor circuit comprises at least three transistors.

3. The semiconductor apparatus of claim 1, wherein each shunt transistor circuit comprises at least three transistors.

4. The semiconductor apparatus of claim 1, wherein each switch transistor circuit is comprised of a multigate field-effect transistor.

5. The semiconductor apparatus of claim 4, wherein each gate of the multigate field-effect transistor is connected to a gate bias terminal by a resistor.

6. The semiconductor apparatus of claim 1, wherein each shunt transistor circuit is comprised of a multigate field-effect transistor.

7. The semiconductor apparatus of claim 6, wherein each gate of the multigate field-effect transistor is connected to a gate bias terminal by a resistor.

* * * * *